US012486567B2

(12) United States Patent
Takahashi

(10) Patent No.: US 12,486,567 B2
(45) Date of Patent: Dec. 2, 2025

(54) FILM FORMATION METHOD AND FILM FORMATION APPARATUS

(71) Applicant: Tokyo Electron Limited, Tokyo (JP)

(72) Inventor: Naoki Takahashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/519,586

(22) Filed: Nov. 27, 2023

(65) Prior Publication Data

US 2024/0183027 A1 Jun. 6, 2024

(30) Foreign Application Priority Data

Dec. 6, 2022 (JP) ................................ 2022-194696

(51) Int. Cl.
*C23C 14/54* (2006.01)
*C23C 14/34* (2006.01)
(Continued)

(52) U.S. Cl.
CPC .......... *C23C 14/54* (2013.01); *C23C 14/3407* (2013.01); *C23C 14/35* (2013.01);
(Continued)

(58) Field of Classification Search
CPC ..... C23C 14/54; C23C 14/3407; C23C 14/35; C23C 14/50; H01J 37/3405;
(Continued)

(56) References Cited

U.S. PATENT DOCUMENTS 6,955,928 B1 * 10/2005 Brennan ............... C23C 14/564 257/E21.525
2003/0146087 A1 * 8/2003 Teng ....................... C23C 14/35 204/192.15

(Continued)

FOREIGN PATENT DOCUMENTS

JP 2000-144408 A 5/2000
JP 2016099809 A * 5/2016 ......... C23C 14/3407

OTHER PUBLICATIONS

JP-2016099809-A Translation (Year: 2016).*

*Primary Examiner* — Patrick S Ott
(74) *Attorney, Agent, or Firm* — Venjuris, P.C.

(57) ABSTRACT

A film formation method includes: providing a film formation apparatus including a substrate support, a target holder, and a magnet unit; forming a film on a substrate by a magnetron sputtering of a target; and performing a serial communication monitoring to repeatedly acquire information on power from a power supply through serial communication. The magnet unit oscillates in a predetermined direction along the target, and the serial communication is performed to switch the power supplied to the target holder when the magnet unit reaches a predetermined power switch position while oscillating, such that when the magnet unit faces the end of the target, the power increases, and when the magnet unit faces the center of the target, the power decreases. The serial communication monitoring stops at least from a predetermined time before the time point when the magnet unit reaches the power switching position until the serial communication is completed.

6 Claims, 7 Drawing Sheets

(51) Int. Cl.
*C23C 14/35* (2006.01)
*C23C 14/50* (2006.01)
*H01J 37/34* (2006.01)

(52) U.S. Cl.
CPC .......... *C23C 14/50* (2013.01); *H01J 37/3405* (2013.01); *H01J 37/3435* (2013.01); *H01J 37/3455* (2013.01); *H01J 2237/332* (2013.01)

(58) Field of Classification Search
CPC ............... H01J 37/3435; H01J 37/3455; H01J 2237/332; H01J 37/3476
See application file for complete search history.

(56) References Cited

U.S. PATENT DOCUMENTS

| | | | | |
|---|---|---|---|---|
| 2015/0136596 | A1* | 5/2015 | Nakamura .......... | H01J 37/3405<br>204/298.16 |
| 2017/0004955 | A1* | 1/2017 | Leeser .................. | H01J 37/321 |
| 2018/0025895 | A1* | 1/2018 | Riker ................ | H01J 37/32082<br>204/192.13 |
| 2018/0358213 | A1* | 12/2018 | Ruzic ....................... | H03K 3/02 |

* cited by examiner

FILM FORMATION METHOD AND FILM FORMATION APPARATUS

CROSS-REFERENCE TO RELATED APPLICATIONS

The present application is based on and claims priority from Japanese Patent Application No. 2022-194696, filed on Dec. 6, 2022, with the Japan Patent Office, the disclosure of which is incorporated herein in its entirety by reference.

TECHNICAL FIELD

The present disclosure relates to a film formation method and a film formation apparatus.

BACKGROUND

Japanese Patent Laid-Open Publication No. 2000-144408 discloses a magnetron sputtering method, in which a magnet moves along the back surface of a plate-shaped target provided on a cathode, and while the magnet generates a magnetron-discharge leakage magnetic field that moves to the surface of the target, a specific discharge power is applied to the cathode, thereby sputtering the target. In the method, in order to keep the voltage of the magnetron discharge substantially constant, the magnet moves in the direction perpendicular to the surface of the target during the period of magnet movement, according to an increase or decrease of the voltage of the magnetron discharge.

SUMMARY

According to an aspect of the present disclosure, a film formation method includes: providing a film formation apparatus including a substrate support that supports a substrate, a target holder that holds a target such that the target faces the substrate support and is supplied with a power from a power supply, and a magnet unit including a magnet provided on a side of the target holder opposite to the substrate support; forming a film on the substrate by a magnetron sputtering of the target; and during the formation of a film, performing a serial communication monitoring to repeatedly acquire information on the power from the power supply through a serial communication. During the formation of a film, the magnet unit oscillates in a predetermined direction along the target held by the target holder, the serial communication with the power supply is performed to switch the power supplied to the target holder at a time point when the magnet unit reaches a predetermined power switch position while oscillating, such that when the magnet unit faces an end of the target in the predetermined direction, the power supplied to the target holder increases, and when the magnet unit faces a center of the target in the predetermined direction, the power supplied to the target holder decreases, and the serial communication monitoring stops at least from a predetermined time before the time point when the magnet unit reaches the power switching position until the serial communication to switch the power supplied to the target holder is completed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF THE DRAWINGS

Figure 1:
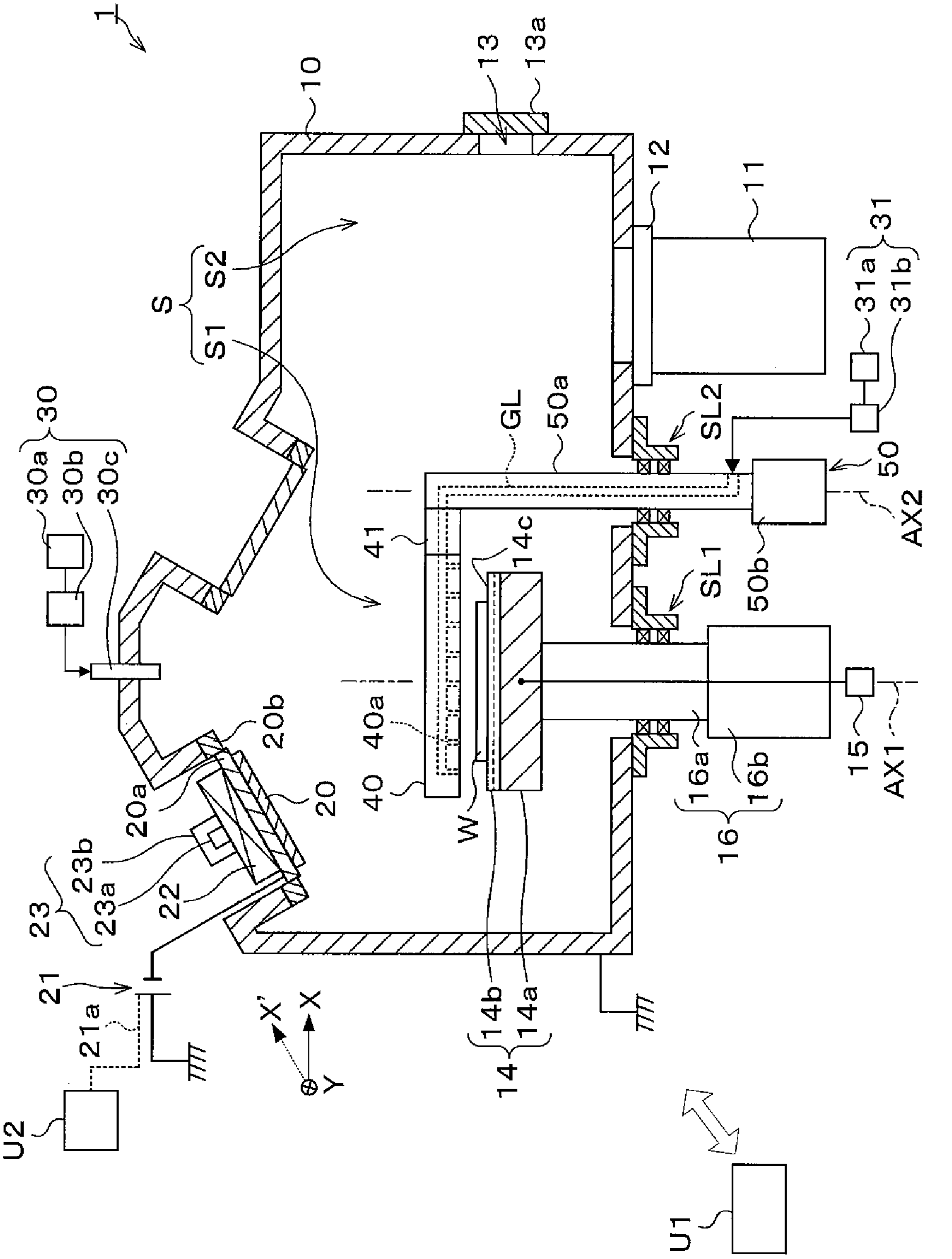
FIG. 1 is a vertical cross-sectional view schematically illustrating a configuration of a film formation apparatus according to an embodiment of the present disclosure.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In a process of manufacturing, for example, semiconductor devices, a film formation process is performed to form a desired film such as an alloy film on a substrate such as a semiconductor wafer (hereinafter, referred to as a "wafer"). The film formation process is performed by, for example, a sputtering of a target.

In a film formation apparatus that forms a film on a substrate by a sputtering of a target, for example, a substrate support unit is provided to support the substrate, and a target holder is provided to hold the target such that the target faces the substrate support unit, and receive an electric power.

When a magnetron sputtering is employed as the sputtering, a magnet smaller than the target may be installed at the side of the target holder opposite to the substrate support unit, and caused to oscillate in a predetermined direction along the target, in order to effectively utilize the entire target. However, in the magnetron sputtering, the characteristics of a formed film (e.g., the composition ratio or the film thickness of an alloy film) may not be sufficiently uniform within the plane of the substrate. Further, when the magnet is moved not only in the direction along the target but also in the direction perpendicular to the surface of the target as in Japanese Patent Laid-Open Publication No. 2000-144408, the size of the apparatus increases.

The technology according to the present disclosure improves the in-plane uniformity of the characteristics of a film formed by the magnetron sputtering while suppressing the increase in size of the apparatus.

Hereinafter, a film formation method and a film formation apparatus according to embodiments of the present disclosure will be described with reference to the drawings. In the descriptions herein, components having substantially the same configuration will be denoted by the same reference numerals, and overlapping descriptions thereof will be omitted.

<Film Formation Apparatus>

Figure 2:
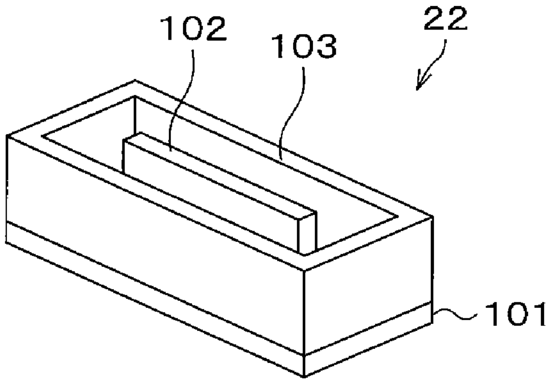
FIG. 2 is a perspective view of a magnet unit.
Figure 3:
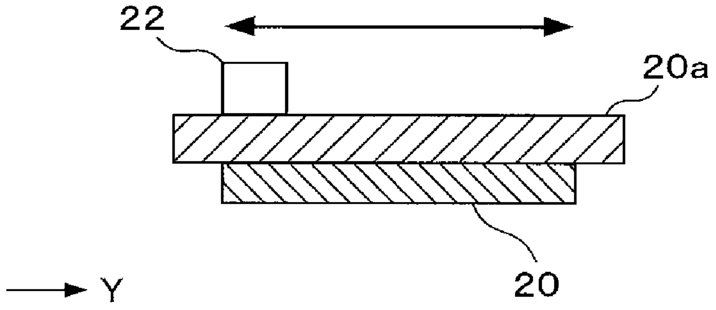
FIG. 3 is a view illustrating a configuration of the periphery of a cathode.

FIG. 1 is a vertical cross-sectional view schematically illustrating a configuration of a film formation apparatus 1 according to an embodiment of the present disclosure. FIG. 2 is a perspective view of a magnet unit to be described later. FIG. 3 is a view illustrating a configuration of the periphery of a cathode.

The film formation apparatus 1 of FIG. 1 forms a film on a wafer W, which serves as a substrate, by a sputtering of a target 20, and specifically, forms an alloy film containing, for example, multiple elements on the wafer W by a magnetron sputtering of the target 20. Here, it is assumed that the film formation apparatus 1 forms an alloy film containing indium (In), gallium (Ga), zinc (Zn), and oxygen (O), i.e., an IGZO film.

The film formation apparatus 1 includes a processing container 10.

The processing container 10 is configured such that the pressure therein may be reduced, accommodates a wafer W, is formed of, for example, aluminum, and is connected to a ground potential. An exhaust apparatus 11 is connected to the bottom of the processing container 10 via an APC valve 12, to depressurize a space S inside the processing container 10. A carry-in/out port 13 for a wafer W is formed in the side wall of the processing container 10, and provided with a gate valve 13*a* that opens/closes the carry-in/out port 13.

Inside the processing container 10, a placing table 14 is provided as a substrate support unit to support a wafer W. A wafer W is placed horizontally on the placing table 14. The placing table 14 includes a base unit 14*a* and an electrostatic chuck 14*b*.

The base unit 14*a* is formed in a disk shape using, for example, aluminum. The base unit 14*a* is provided with a heater (not illustrated) that heats a wafer W. A cooling mechanism may be provided instead of the heater, or both the heater and the cooling mechanism may be provided.

The electrostatic chuck 14*b* includes, for example, a dielectric film and an electrode provided as an inner layer of the dielectric film, and is provided on the base unit 14*a*. A DC power supply 15 is connected to the electrode of the electrostatic chuck 14*b*. A wafer W placed on the electrostatic chuck 14*b* is adsorbed to and held on the electrostatic chuck 14*b* by an electrostatic attraction force generated when a DC voltage is applied to the electrode of the electrostatic chuck 14*b* from the DC power supply 15. Hereinafter, the upper surface 14*c* of the electrostatic chuck 14*b*, which serves as a substrate adsorption surface, will be referred to as the wafer adsorption surface 14*c*.

The placing table 14 is connected to a driving mechanism 16 that serves as a rotary driving unit. The driving mechanism 16 includes, for example, a support shaft 16*a* and a driving unit 16*b*.

The support shaft 16*a* extends vertically to penetrate the bottom wall of the processing container 10. A sealing member SL1 is provided between the support shaft 16*a* and the bottom wall of the processing container 10. The sealing member SL1 seals the space between the bottom wall of the processing container 10 and the support shaft 16*a*, such that the support shaft 16*a* may rotate and move up and down, and is, for example, a magnetic fluid seal. The upper end of the support shaft 16*a* is connected to the center of the lower surface of the placing table 14, and the lower end thereof is connected to the driving unit 16*b*.

The driving unit 16*b* includes, for example, a driving source such as a motor, and generates a driving force for rotating and vertically moving the support shaft 16*a*. The support shaft 16*a* rotates about its axis AX1 by the driving force generated by the driving unit 16*b*, and as a result, the placing table 14 rotates about the axis AX1. Further, the support shaft 16*a* moves up and down by the driving force generated by the driving unit 16*b*, and as a result, the placing table 14 moves up and down.

The driving mechanism 16 (specifically, the driving unit 16*b*) is controlled by a control unit U1 to be described later.

A target holder 20*a* is provided above the placing table 14 to hold the target 20 that emits sputtered particles, and is formed of a conductive material (hereinafter, referred to as a "holder 20*a*").

The holder 20*a* is attached to the ceiling of the processing container 10. A through hole is formed at the attachment position of the holder 20*a* in the processing container 10. An insulating member 20*b* is provided on the inner wall surface of the processing container 10 to surround the through hole. The holder 20*a* is attached to the processing container 10 via the insulating member 20*b* so as to close the through hole.

The holder 20*a* holds the target 20 such that the target 20 is positioned inside the processing container 10 and faces the placing table 14.

The target 20 is made of, for example, an alloy containing In, Ga, Zn, and O, i.e., IGZO. The target 20 is formed in, for example, a rectangular shape in a plan view. In a state where the target 20 is held in the holder 20*a*, the longitudinal direction of the target 20 extends in the depth direction of the apparatus (e.g., the Y direction in FIG. 1). The length of the target 20 in the depth direction of the apparatus is, for example, 150 mm to 200 mm.

A power supply 21 is connected to the holder 20*a*. The power supply 21 supplies a power to the holder 20*a*. The power supply 21 is, for example, a DC power supply. The power supply 21 is connected to a power supply control unit U2 via a serial communication cable 21*a*.

The power supply 21 and the power supply control unit U2 transmit and receive information including, for example, data and commands through a serial communication. For example, the power supply 21 transmits, for example, the magnitude, current, and voltage of the power output from the power supply 21, to the power supply control unit U2 through the serial communication. Meanwhile, the power supply control unit U2 transmits, for example, a command for specifying the magnitude of the power to be output from the power supply 21, to the power supply 21 through the serial communication. The command for specifying the magnitude of the power to be output from the power supply 21 is, for example, a command that specifies a reference value of the power to be output from the power supply 21 (hereinafter, referred to as the "base power"), or a command that specifies the ratio of the magnitude of the power to be actually output from the power supply 21 with respect to the base power (hereinafter, referred to as the "output ratio"). The base power or the output ratio is input by an operator through an input unit included in the control unit U1 to be described later.

The power supply control unit U2 includes a processor and a memory, and the memory stores programs including commands for controlling the power supply 21.

A magnet unit 22 is provided on the side of the holder 20*a* opposite to the placing table 14, i.e., on the back surface of the holder 20*a* outside the processing container 10. The magnet unit 22 forms a magnetic field that leaks to the front side of the target 20 held by the holder 20*a*. For example, as illustrated in FIG. 2, the magnet unit 22 is configured such that a rectangular parallelepiped central magnet 102 and an outer peripheral magnet 103 having a rectangular ring shape in a plan view are arranged on a flat plate-shaped yoke 101. The central magnet 102 is provided along the longitudinal direction of the yoke 101, and the outer peripheral magnet 103 is provided to surround the four sides of the central magnet 102 in a plan view. The central magnet 102 and the outer peripheral magnet 103 are magnetized in opposite directions, along the direction perpendicular to the surface of the yoke 101 on the side of the central magnet 102.

The magnet unit 22 is formed to be smaller than the target 20, and for example, the length thereof in the depth direction of the apparatus (e.g., the Y direction in FIG. 1) (specifically, the length of the outer peripheral magnet 103 in the depth direction of the apparatus) is about ⅓ of the target 20.

The magnet unit 22 is connected to a movement mechanism 23. The movement mechanism 23 causes the magnet unit 22 to oscillate, i.e., reciprocate in a predetermined direction along the target 20 held by the holder 20*a*. Specifically, the movement mechanism 23 causes the magnet unit 22 to oscillate, i.e., reciprocate along the back surface of the holder 20*a* in the depth direction of the apparatus, which is the longitudinal direction of the target 20 (e.g., the Y direction in FIGS. 1 and 3).

The movement mechanism 23 includes a rail 23*a* that extends along, for example, the depth direction of the apparatus (e.g., the Y direction in FIGS. 1 and 3), and a driving unit 23*b* that includes a driving source such as a motor. By a driving force generated by the driving unit 23*b*, the magnet unit 22 moves along the rail 23*a* in the depth direction of the apparatus (e.g., the Y direction in FIGS. 1 and 3). Specifically, by the driving force generated by the driving unit 23*b*, the magnet unit 22 oscillates between a position facing one end of the target 20 in the depth direction of the apparatus (e.g., the negative-side end in the Y direction of FIGS. 1 and 3) and a position facing the other end of the target 20 (e.g., the positive-side end in the Y direction of FIGS. 1 and 3). As a result, the target 20 is prevented from being consumed locally, and the substantially entire target 20 may be used.

The movement mechanism 23 (specifically, the driving unit 23*b*) is controlled by the control unit U1 to be described later.

The film formation apparatus 1 further includes a gas supply unit 30 that supplies a gas into the processing container 10. The gas supply unit 30 includes, for example, a gas source 30*a*, a flow rate controller 30*b* such as a mass flow controller, and a gas introduction unit 30*c*. The gas source 30*a* stores a gas (e.g., Ar gas) to be excited in the processing container 10. The gas source 30*a* is connected to the gas introduction unit 30*c* via the flow rate controller 30*b*. The gas introduction unit 30*c* is a member that introduces the gas from the gas source 30*a* into the processing container 10.

When the gas is supplied from the gas supply unit 30, and a power is supplied to the target 20 by the power supply 21, the gas supplied into the processing container 10 is excited. Further, a magnetic field is generated near the front surface of the target 20 by the magnet unit 22, and plasma is concentrated in the vicinity of the front surface of the target 20. Then, positive ions in the plasma collide with the target 20, so that the substance making up the target 20 is emitted from the target 20 as sputtered particles. As a result, an IGZO film is formed on the wafer W.

The film formation apparatus 1 further includes a head 40. The head 40 is a member that ejects an oxidizing gas to oxidize the film formed on the wafer W toward the placing table 14. The head 40 is formed, for example, in a circular shape in a plan view, and has a larger area than the wafer adsorption surface 14*c* of the placing table 14 in ae plan view.

The head 40 moves between a processing position and a retreat position according to an operation of a driving mechanism 50 to be described later. The processing position is a position above the placing table 14, and a position between the target 20 and the placing table 14 inside the processing space S1. A retreat position P2 is a position away from the processing space S1 inside the processing container 10, and a position where the head 40 does not overlap with the placing table 14 in a top view inside a space S2 different from the processing space S1.

One end of a connection unit 41 is connected to the circumferential edge of the head 40 to extend in the direction perpendicular to an axis AX2 of a support shaft 50*a* of the driving mechanism 50. The support shaft 50*a* is connected to the other end of the connection unit 41. A gas line GL for the oxidizing gas is formed in the head 40, the connection unit 41, and the support shaft 50*a*. An end of the gas line GL opposite to the head 40 is disposed outside the processing container 10, and connected to a gas supply 31. The gas supply unit 31 includes, for example, a gas source 31*a* and a flow rate controller 31*b* such as a mass flow controller. The gas source 31*a* stores the oxidizing gas (e.g., $O_2$ gas). The gas source 31*a* is connected to the gas line GL via the flow rate controller 31*b*.

Inside the head 40, the gas line GL is connected to a plurality of gas ejection holes 40*a* provided in the head 40. The plurality of gas ejection holes 40*a* are opened downward, i.e., toward the placing table 14.

The film formation apparatus 1 includes the driving mechanism 50 as a repeat mechanism.

The driving mechanism 50 includes, for example, the support shaft 50*a* and a driving unit 50*b*.

The support shaft 50*a* extends along the axis AX2. The axis AX2 is substantially parallel to the axis AX1, and extends vertically beside the placing table 14.

Further, the support shaft 50*a* extends vertically to penetrate the bottom wall of the processing container 10. A sealing member SL2 is provided between the support shaft 50*a* and the bottom wall of the processing container 10. The sealing member SL2 is a member that seals the space between the bottom wall of the processing container 10 and the support shaft 50*a*, such that the support shaft 50*a* may rotate and move up and down, and is, for example, a magnetic fluid seal.

The driving unit 50*b* is connected to the lower end of the support shaft 50*a*.

The driving unit 50*b* generates a driving force for rotating and vertically moving the support shaft 50*a*. When the support shaft 50*a* rotates about the axis AX2, the head 40 pivots about the axis AX2, and when the support shaft 50*a* moves up and down, the head 40 moves up and down.

The film formation apparatus 1 further includes the control unit U1. The control unit U1 is configured with a computer including a processor such as a central processing unit (CPU) and a memory, and includes a program storage unit (not illustrated). The program storage unit stores programs including commands for controlling, for example, the power supply control unit U2 and the driving units 16*b*, 23*b*, and 50*b* to implement a wafer processing using the film formation apparatus 1, which will be described later. The programs may be recorded in a computer-readable storage medium, and installed into the control unit U1 from the storage medium. The storage medium may be a temporary or non-temporary storage medium.

The control unit U1 further includes an input unit that allows an operator to input various types of information. The input unit includes, for example, at least one of a keyboard, a mouse, and a touch panel.

<Wafer Processing>

Figures 4A, 4B, 4C:
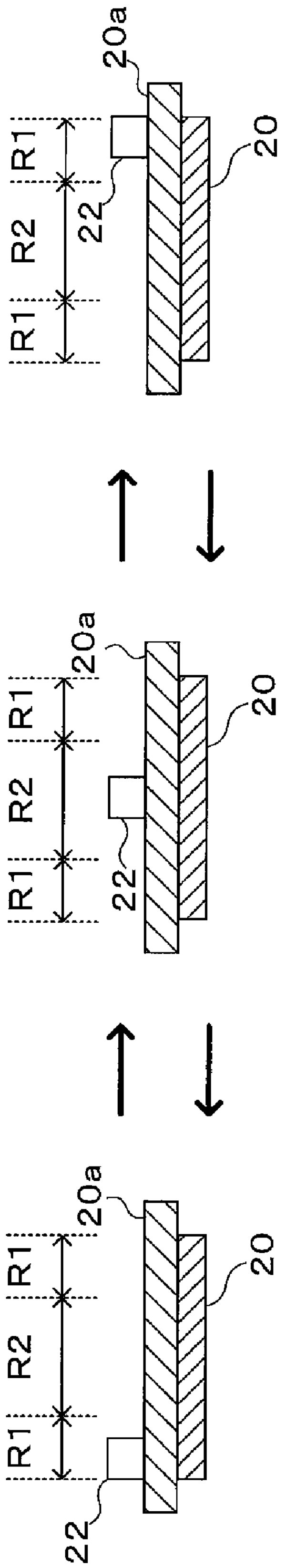
FIGS. 4A to 4C are views illustrating an operation of the magnet unit during a wafer processing.
Figure 5:
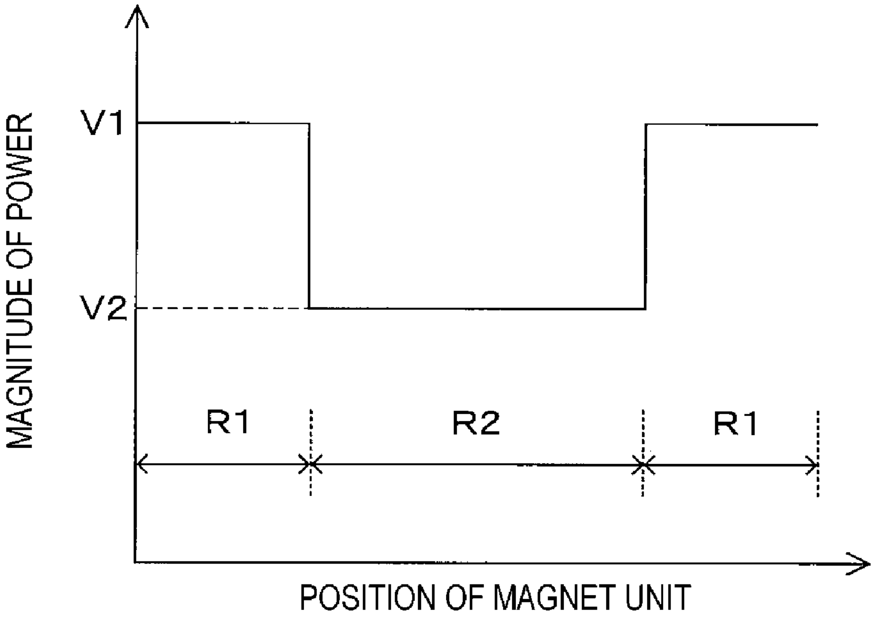
FIG. 5 is a view illustrating a relationship between a position of the magnet unit and a power supplied to a target holder during the wafer processing.
Figure 6:
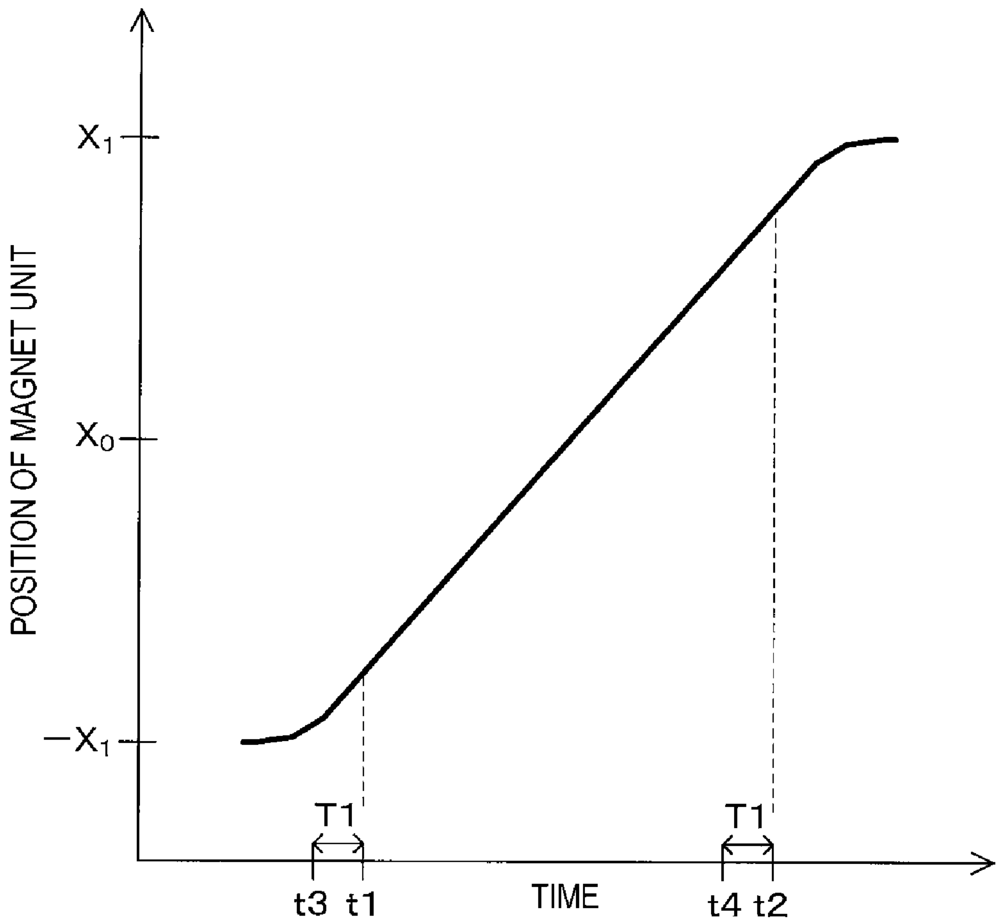
FIG. 6 is a view illustrating a time period during which a serial communication monitoring is stopped.

Next, an example of a wafer processing, including a film formation process, using the film formation apparatus 1 will be described using FIGS. 4A to 4C, 5, and 6. FIGS. 4A to 4C are views illustrating the operation of the magnet unit 22 during a wafer processing. FIG. 5 is a view illustrating the relationship between the position of the magnet unit 22 during the wafer processing (e.g., the horizontal axis) and the power supplied to the holder 20*a* (e.g. the vertical axis). FIG. 6 is a view illustrating a time period during which a serial communication monitoring to be described later is stopped. In FIG. 6, the horizontal axis represents time, and the vertical axis represents the position of the magnet unit 22. In FIG. 6, the position "x0" is the position where the magnet unit 22 faces the center of the target 20 in the oscillation direction of the magnet unit 22. The position "x1" is the position where the magnet unit 22 faces one end of the target 20 in the oscillation direction of the magnet unit 22. The position "−x1" is the position where the magnet unit 22 faces the other end of the target 20 in the oscillation direction of the magnet unit 22. Further, each step described below is performed under the control by the control unit U1.

(Step S1: Carry-In)

First, a wafer W is carried into the processing container 10.

Specifically, the gate valve 13*a* is opened, and a transfer mechanism (not illustrated) holding the wafer W is inserted into the processing container 10 through the carry-in/out port 13 from an evacuated transfer chamber (not illustrated) adjacent to the processing container 10 that has been regulated to a desired pressure by the exhaust apparatus 11. Then, the wafer W is transferred from the transfer mechanism onto support pins that have been moved up (not illustrated), and thereafter, the transfer mechanism is removed out of the processing container 10 so that the gate valve 13*a* is closed. At the same time, the support pins move downward such that the wafer W is placed on the placing table 14 and adsorbed/held by the electrostatic attraction force of the electrostatic chuck 14*b*.

Subsequently, the IGZO film is formed on the wafer W by the magnetron sputtering of the target 20. In this process, for example, the following steps S2 to S4 are performed.

(Step S2: Start of Magnetron Sputtering)

Specifically, first, the magnetron sputtering of the target 20 is started.

The magnetron sputtering is performed in a state where the magnet unit 22 is oscillating by the movement mechanism 23, specifically, in a state where the magnet unit 22 is oscillating at a constant speed (excluding the turn-around part) by the movement mechanism 23. The magnetron sputtering may be performed in a state where the placing table 14 is rotating by the driving mechanism 16.

During the magnetron sputtering, for example, Ar gas is supplied as a sputtering gas into the processing container 10 from the gas supply unit 30, and a magnetic field is generated by the magnet unit 22. Further, during the magnetron sputtering, a power is supplied to the target 20 from the power supply 21. The Ar gas in the processing container 10 is ionized by the power from the power supply 21, and electrons generated by the ionization drift by the magnetic field formed by the magnet unit 22 and the electric field generated by the power from the power supply 21, so that high-density plasma is produced. The surface of the target 60 is sputtered by the Ar ions in the plasma, and the sputtered particles are deposited on the wafer W. As a result, the IGZO film is formed on the wafer W.

(Step S3: Serial Communication Monitoring)

A serial communication monitoring is performed by the power supply control unit U2 at least from the start to the end of the magnetron sputtering, i.e., during the magnetron sputtering.

The serial communication monitoring indicates repeatedly acquiring information on the power output by the power supply 21, from the power supply 21 through a serial communication.

The information acquired by the serial communication monitoring is specifically at least one of the magnitude, current, and voltage of the power output from the power supply 21, and may be used to determine, for example, the state of plasma in the processing container 10. The information acquired by the power supply control unit U2 is transmitted to the control unit U1.

(Step S4: End of Magnetron Sputtering)

When a predetermined condition is met (e.g., when a predetermined time elapses from the start of the magnetron sputtering), the magnetron sputtering of the target 20 is terminated.

Specifically, the gas supply from the gas supply unit 30, the power supply from the power supply 21 to the target 20, and the oscillation of the magnet unit 22 are stopped. In a case where the placing table 14 is rotating, the rotation is also stopped. The serial communication monitoring may also be stopped.

In the wafer processing using the film formation apparatus 1, in order to achieve (a) and (b) described below, the power supply control unit U2 performs a serial communication with the power supply 21 during the magnetron sputtering described above to switch the power supplied to the holder 20*a* at a time point when the magnet unit 22 reaches a predetermined power switch position during the oscillation (hereinafter, referred to as a "power switch serial communication"). In the descriptions hereinafter, the "end of the target 20" indicates the end of the target 20 in the depth direction of the apparatus (e.g., the Y direction in FIG. 1 and others), i.e., in the oscillation direction of the magnet unit 22, and the "center of the target 20" indicates the center of the target 20 in the depth direction of the apparatus (e.g., the Y direction in FIG. 1 and others), i.e., in the oscillation direction of the magnet unit 22.

(a) When the magnet unit 22 faces the end of the target 20 as illustrated in FIGS. 4A and 4C, the power supplied to the holder 20*a* is increased (specifically, when the magnet unit 22 is positioned in the region R1 facing the end of the target 20 as illustrated in FIG. 5, the power supplied to the holder 20*a* is PW1).

(b) When the magnet unit 22 faces the center of the target 20 as illustrated in FIG. 4B, the power supplied to the holder 20*a* is decreased (specifically, when the magnet unit 22 is positioned in the region R2 facing the center of the target 20 as illustrated in FIG. 5, the power supplied to the holder 20*a* is PW2 (<PW1)).

For example, PW1 is the base power×100%, and PW2 is the base power×30% to 70%.

In the power switch serial communication, a command for specifying the output percentage above is transmitted to the power supply 21. A command for specifying the base power is transmitted in advance to the power supply 21.

The reason for switching the power (e.g., the magnitude thereof) will be described later.

In the wafer processing using the film formation apparatus 1, the serial communication monitoring by the power supply control unit U2 described above is stopped at least for the time period of (c) below during the magnetron sputtering.

(c) As illustrated in FIG. 6, from a predetermined time T1 before a time point t1 or t2 when the magnet unit 22 reaches the power switch position during the oscillation until the power switch serial communication is completed (i.e., from a time point t3 until the power switch serial communication is completed or from a time point t4 until the power switch serial communication is completed).

The predetermined time T1 above is longer than a time required to acquire the information on the power output by the power supply 21 once during the serial communication monitoring. The predetermined time T1 above is, for example, two or more times but three or less times the time.

The reason for stopping the serial communication monitoring will be described later.

The time period for stopping the serial communication monitoring during the magnetron sputtering may be only the time period from the predetermined time T1 before the time point when the magnet unit 22 reaches the power switch position until the power switch serial communication is completed.

(Step S5: Carry-Out)

After the IGZO film is formed by the magnetron sputtering, the wafer W is carried out from the processing container 10. Specifically, the wafer W is carried out from the processing container 10 in reverse to the carry-in operation in step S1.

Then, the process returns to the carry-in process described above, so that the next film formation target wafer W is processed in the same manner.

Before the carry-out in step S5, a process may be performed, which oxidizes the film formed by the magnetron sputtering. Specifically, before the carry-out in step S5, the process may be performed, which oxidizes the film formed by the magnetron sputtering using the head 40.

In a case where the oxidation process is not performed, the film formation apparatus 1 may omit the head 40 and related components thereof.

<Reason for Switching Power>

Figure 7:
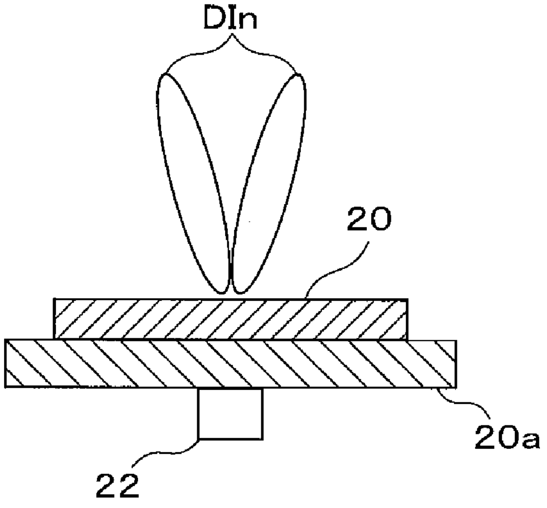
FIG. 7 is a view conceptually illustrating an angular distribution of indium emitted from a target made of IGZO by a sputtering.
Figure 8:
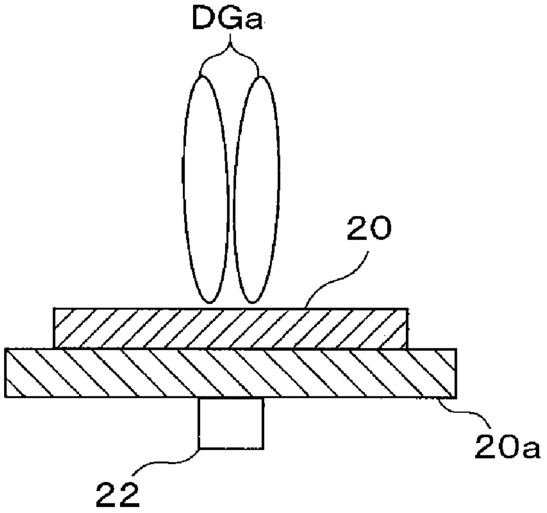
FIG. 8 is a view conceptually illustrating an angular distribution of gallium emitted from a target made of IGZO by a sputtering.
Figure 9:
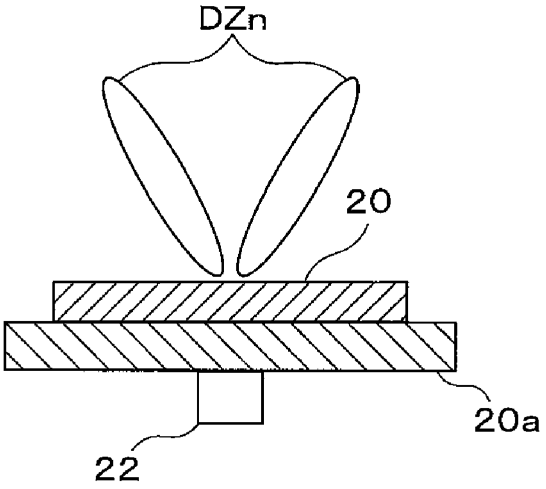
FIG. 9 is a view conceptually illustrating an angular distribution of zinc emitted from a target made of IGZO by a sputtering.
Figure 10:
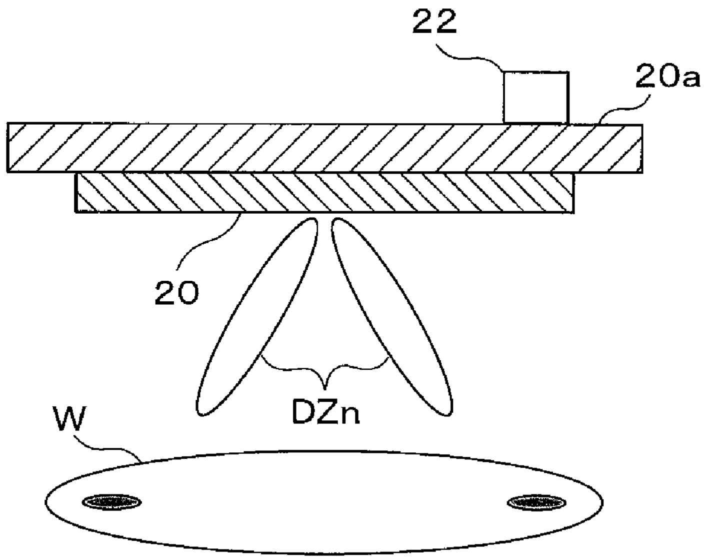
FIG. 10 is a view illustrating a relationship between a position of the magnet unit and a deposition position of zinc on a wafer.
Figure 11:
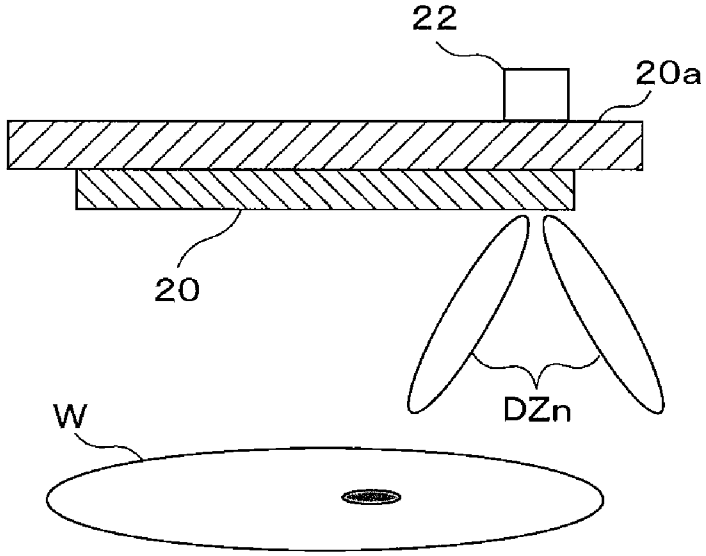
FIG. 11 is a view illustrating a relationship between a position of the magnet unit and a deposition position of zinc on a wafer.

Next, descriptions will be made on the reason for switching the power (e.g., the magnitude thereof) supplied to the holder 20*a* during the magnetron sputtering as described above, using FIGS. 7 to 11. FIGS. 7 to 9 are views conceptually illustrating angular distributions of metallic elements emitted by the sputtering from the target 20 made of the IGZO. FIGS. 7 to 9 conceptually represent angular distributions of In, Ga, and Zn, respectively. FIGS. 10 and 11 are views illustrating the relationship between the position of the magnet unit 22 and the deposition position of Zn on the wafer W. In the descriptions hereinafter, the "normal direction of the target surface of the target 20" indicates the normal direction of the target surface of the target 20 that passes through the magnet unit 22 (specifically, the center of the magnet unit 22).

The angles of the metallic elements emitted from the target 20 by the sputtering are different according to sputtering conditions (e.g., a pressure), and are also different according to types of metallic elements even under the same sputtering conditions.

For example, under sputtering conditions generally used for the target 20 made of the IGZO, the angular distribution of Zn is different from those of In and Ga as illustrated in FIGS. 7 to 9.

Specifically, as illustrated in FIGS. 7 and 8, the angular distribution DIn of In and the angular distribution DGa of Ga are frequent in the direction normal of the target surface of the target 20. That is, In and Ga are mainly emitted in the direction normal of the target surface of the target 20.

Thus, under the condition that the power supplied to the holder 20*a* is constant, In and Ga are deposited more at the center of the wafer W when the center of the target 20 and the magnet unit 22 face each other, and deposited more at the periphery of the wafer W when the end of the target 20 and the magnet unit 22 face each other.

Meanwhile, as illustrated in FIG. 9, the angular distribution DZn of Zn is frequent in the direction inclined to the normal direction of the target surface of the target 20. That is, Zn is mainly emitted in the direction tilted from the normal direction of the target surface of the target 20.

Thus, under the condition that the power supplied to the holder 20*a* is constant, Zn is deposited more at the periphery of the wafer W when the center of the target 20 and the magnet unit 22 face each other, as illustrated in gray in FIG. 10. Further, as illustrated in gray in FIG. 11, Zn is deposited more at the center of the wafer W when the end of the target 20 and the magnet unit 22 face each other.

The time during which the magnet unit 22 is positioned in the region facing the center of the target 20 is longer than the time during which the magnet unit 22 is positioned in the region facing the periphery of the target 20.

Further, when the power supplied to the holder 20*a* is kept constant in the configuration where the distance between the magnet unit 22 and the target 20 is constant as in the present embodiment, the density of plasma generated near the surface of the target 20 also becomes constant.

Thus, when the power supplied to the holder 20*a* is kept constant, the deposition amount of Zn may differ significantly between the center and the periphery of the wafer W, and as a result, the composition ratio of the IGZO film becomes ununiform within the plane of the wafer W. Specifically, when the power supplied to the holder 20*a* is kept constant, the density of Zn in the IGZO film on the wafer W may decrease at the center of the wafer W and increase at the periphery of the wafer W.

In consideration of this point, in the wafer processing using the film formation apparatus 1, the power (e.g., the magnitude thereof) supplied to the holder 20*a* is switched during the magnetron sputtering, such that the power increases when the magnet unit 22 faces the end of the target 20, and decreases when the magnet unit 22 faces the center of the target 20.

Thus, while maintaining the deposition amount of Zn at the center of the wafer W, the deposition amount of Zn at the periphery of the wafer W may be suppressed. As a result, while maintaining the density of Zn of the IGZO film at the center of the wafer W, the density of Zn of the IGZO at the periphery of the wafer W may be decreased. Therefore, the composition ratio of the IGZO film, i.e., the in-plane uniformity of the Zn density in the IGZO film may be improved.

Further, as described above, by switching the power (e.g., the magnitude thereof) supplied to the holder 20*a* during the magnetron sputtering, the deposition amounts of In and Ga at the center of the wafer W may be suppressed while maintaining the deposition amounts of In and Ga at the periphery of the wafer W. Accordingly, the densities of In and Ga of the IGZO film may be decreased at the center of the wafer W while maintaining the densities of In and Ga of the IGZO film at the periphery of the wafer W. As a result, the density of Zn in the IGZO film at the periphery of the wafer W may be relatively decreased. From this point of view, the composition ratio of the IGZO film, i.e., the in-plane uniformity of the Zn density in the IGZO film may also be improved.

<Reason for Stopping Serial Communication Monitoring>

Next, descriptions will be made on the reason for stopping the serial communication monitoring as described above.

In the serial communication monitoring, the time required for the power supply control unit U2 to acquire the information on the power output by the power supply 21 once through the serial communication is relatively long, and is, for example, about 1% of the oscillation period of the magnet unit 22 (e.g., about 40 ms when the oscillation period is 4 s). Thus, in a case where the serial communication monitoring is being performed at the time points t1 and t2 when the magnet unit 22 reaches the power switch position during the oscillation, the power switch serial communication may not be performed at the time points t1 and t2, and the in-plane uniformity of the Zn density in the IGZO film may not be sufficiently improved.

Accordingly, in the wafer processing using the film formation apparatus 1, the serial communication monitoring is stopped from the predetermined time T1 before the time points t1 and t2 when the magnet unit 22 reaches the power switch position during the oscillation until the power switch serial communication is completed.

Thus, the power switch serial communication may be performed at the time points t1 and t2. As a result, the in-plane uniformity of the Zn density in the IGZO film may be reliably improved.

<Main Effects of Present Embodiment>

As described above, according to the present embodiment, it is possible to improve the in-plane uniformity of characteristics of a film formed by the magnetron sputtering (specifically, the Zn density in the IGZO film). Further, in the present embodiment, it is unnecessary to provide a mechanism for moving the magnet unit 22 in the direction perpendicular to the surface of the target 20, so that the increase in size of the film formation apparatus 1 may be suppressed.

That is, according to the present embodiment, the in-plane uniformity of characteristics of a film formed by the magnetron sputtering may be improved while suppressing the increase in size of the apparatus.

Unlike the present embodiment, in a case where the magnet unit 22 is moved in the direction perpendicular to the surface of the target 20 in order to improve the in-plane uniformity of the Zn density distribution, it takes time to change the characteristics of the Zn emission from the target 20. This configuration may not affect the in-plane uniformity of the characteristics of a film to be formed when the target 20 is large such as a target for a glass substrate, but may affect the in-plane uniformity when the target 20 is small as a target for a wafer W. Meanwhile, in the present embodiment, since the characteristics of the Zn emission from the target 20 are changed by switching the power (e.g., the magnitude thereof) supplied to the holder 20*a*, the time required for the change is short. Thus, even when the target 20 is small such as a target for a wafer W, the in-plane uniformity of the characteristics of a film to be formed may be sufficiently improved.

Further, as described above, the time period for stopping the serial communication monitoring during the magnetron sputtering may be only the time period from the predetermined time T1 before the time point when the magnet unit 22 reaches the power switch position until the power switch serial communication is completed. Thus, the power switch serial communication may be performed at the time point when the magnet unit 22 reaches the power switch position, while reducing the time for stopping the serial communication monitoring.

<Modifications>

In the embodiment above, the power supply 21 is a DC power supply. However, the power supply 21 may be an AC power supply.

In the embodiment above, the power supply control unit U2 is provided independently of the control unit U1. However, the control unit U1 may also serve as the power supply control unit U2.

In the embodiment above, the IGZO film is formed using the target 20 made of IGZO. However, when the angular distribution of Zn is frequent in the direction inclined to the normal direction of the target surface of the target, the technology of the present disclosure may be applied to a case where a Zn film other than the IGZO film is formed by using a target containing Zn other than the target made of IGZO. In this case as well, the in-plane uniformity of the characteristics of the film formed by the magnetron sputtering (specifically, the film composition or film thickness) may be improved. Further, the technology of the present disclosure may also be applied to a case of using a target containing an element, other than Zn, of which angular distribution is frequent in the direction inclined to the normal direction of the target surface of the target.

The technical scope of the present disclosure also includes the following examples of configuration.

(1) A film formation method including:

providing a film formation apparatus including
- a substrate support that supports a substrate,
- a target holder that holds a target such that the target faces the substrate support, and is supplied with a power from a power supply, and
- a magnet unit including a magnet provided on aside of the target holder opposite to the substrate support;

forming a film on the substrate by a magnetron sputtering of the target; and during the forming the film, performing a serial communication monitoring to repeatedly acquire information on the power from the power supply through a serial communication, wherein during the forming the film, the magnet unit oscillates in a predetermined direction along the target held by the target holder, the serial communication with the power supply is performed to switch the power supplied to the target holder at a time point when the magnet unit reaches a predetermined power switch position while oscillating, such that when the magnet unit faces an end of the target in the predetermined direction, the power supplied to the target holder increases, and when the magnet unit faces a center of the target in the predetermined direction, the power supplied to the target holder decreases, and the serial communication monitoring stops at least from a predetermined time before the time point when the magnet unit reaches the power switching position until the serial communication to switch the power supplied to the target holder is completed.

(2) The film formation method described in (1) above, wherein the predetermined time is longer than a time required to acquire the information on the power once in the serial communication monitoring.

(3) The film formation method described in (1) or (2) above, wherein during the forming the film, the serial communication monitoring stops only from the predetermined time before the time point when the magnet unit reaches the power switch position until the serial communication to switch the power supplied to the target holder is completed.

(4) A film formation apparatus including:

a substrate support that supports a substrate;

a target holder that holds a target to face the substrate support, and is supplied with a power from a power supply, and a magnet unit including a magnet provided on aside of the target holder opposite to the substrate support;

a mover that causes the magnet unit to oscillate in a predetermined direction along the target held by the target holder; and a controller, wherein the controller controls a power supply controller to perform a process including:

forming a film on the substrate by a magnetron sputtering of the target, and during the forming a film, performing a serial communication monitoring to repeatedly acquire information on the power from the power supply through a serial communication, wherein during the forming the film, the magnet unit oscillates in a predetermined direction along the target held by the target holder, at a time point when the magnet unit reaches a predetermined power switch position while oscillating, the serial communication with the power supply is performed to switch the power supplied to the target holder, such that when the magnet unit faces an end of the target in the predetermined direction, the power supplied to the target holder increases, and when the magnet unit faces a center of the target in the predetermined direction, the power supplied to the target holder decreases, and the serial communication monitoring stops at least from a predetermined time before the time point when the magnet unit reaches the power switching position until the serial communication to switch the power supplied to the target holder is completed.

According to the present disclosure, it is possible to improve the in-plane uniformity of characteristics of a film formed by a magnetron sputtering while suppressing the increaser in apparatus size.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film formation method comprising:

providing a film formation apparatus including a substrate support configured to support a substrate, a target holder configured to hold a target such that the target faces the substrate support, and supplied with a power from a power supply, and a magnet unit including a magnet provided on a side of the target holder opposite to the substrate support;

forming a film on the substrate by a magnetron sputtering of the target; and during the forming the film, performing a first serial communication to repeatedly acquire information on the power from the power supply, wherein during the forming the film, the magnet unit oscillates in a predetermined direction along the target held by the target holder, a second serial communication with the power supply is performed to switch the power supplied to the target holder at a time point when the magnet unit reaches a predetermined power switching position while oscillating, such that when the magnet unit faces an end of the target in the predetermined direction, the power supplied to the target holder increases, and when the magnet unit faces a center of the target in the predetermined direction, the power supplied to the target holder decreases, and the first serial communication stops for a time period from a predetermined time before the time point when the magnet unit reaches the power switching position until the second serial communication to switch the power supplied to the target holder is completed.

2. The film formation method according to claim 1, wherein the predetermined time is longer than a time required to acquire the information on the power once in the first serial communication.

3. The film formation method according to claim 1, wherein during the forming the film, the first serial communication stops only from the predetermined time before the time point when the magnet unit reaches the power switching position until the second serial communication to switch the power supplied to the target holder is completed.

4. The film formation method according to claim 1, wherein the power switching position includes a first power switching position between a first position where the magnet unit faces one end of the target in the predetermined direction and a second position where the magnet unit faces the center of the target and a second power switching position between the second position and a third position where the magnet unit faces the other end of the target in the predetermined direction, and the magnet unit oscillates at a constant speed from the first power switching position to the second power switching position.

5. The film formation method according to claim 1, wherein the first serial communication is performed to repeatedly acquire the information including at least one of magnitude, current, and voltage of the power output from the power supply, and the information is used to determine state of plasma in the film formation apparatus.

6. A film formation apparatus comprising;

a substrate support configured to support a substrate;

a target holder configured to hold a target to face the substrate support, and supplied with a power from a power supply, and a magnet unit including a magnet provided on a side of the target holder opposite to the substrate support;

a mover configured to cause the magnet unit to oscillate in a predetermined direction along the target held by the target holder; and a controller, wherein the controller controls a power supply controller to perform a process including:

forming a film on the substrate by a magnetron sputtering of the target, and during the forming the film, performing a first serial communication to repeatedly acquire information on the power from the power supply, wherein during the forming the film, the magnet unit oscillates in a predetermined direction along the target held by the target holder, a second serial communication with the power supply is performed to switch the power supplied to the target holder at a time point when the magnet unit reaches a predetermined power switching position while oscillating, such that when the magnet unit faces an end of the target in the predetermined direction, the power supplied to the target holder increases, and when the magnet unit faces a center of the target in the predetermined direction, the power supplied to the target holder decreases, and the first serial communication stops for a time period from a predetermined time before the time point when the magnet unit reaches the predetermined power switching position until the second serial communication to switch the power supplied to the target holder is completed.

* * * * *